US009509254B1

(12) United States Patent
Cripe

(10) Patent No.: US 9,509,254 B1
(45) Date of Patent: Nov. 29, 2016

(54) BI-DIRECTIONAL SOFT-SWITCHING CLASS-D POWER AMPLIFIER

(71) Applicant: David W. Cripe, Mount Vernon, IA (US)

(72) Inventor: David W. Cripe, Mount Vernon, IA (US)

(73) Assignee: Rockwell Collins, Inc., Cedar Rapids, IA (US)

( * ) Notice: Subject to any disclaimer, the term of this patent is extended or adjusted under 35 U.S.C. 154(b) by 0 days.

(21) Appl. No.: 14/729,312

(22) Filed: Jun. 3, 2015

(51) Int. Cl.
| H02M 7/538 | (2007.01) |
| H03F 3/38 | (2006.01) |
| H03F 1/14 | (2006.01) |
| H02M 7/537 | (2006.01) |
| H03F 3/217 | (2006.01) |
| H02M 7/5387 | (2007.01) |
| H03F 3/45 | (2006.01) |
| H02M 7/48 | (2007.01) |
| H02M 1/00 | (2006.01) |

(52) U.S. Cl.
CPC ............. *H03F 1/14* (2013.01); *H02M 7/537* (2013.01); *H02M 7/5387* (2013.01); *H02M 7/53871* (2013.01); *H03F 3/217* (2013.01); *H03F 3/38* (2013.01); *H03F 3/45* (2013.01); *H02M 2001/0054* (2013.01); *H02M 2001/0058* (2013.01); *H02M 2007/4811* (2013.01); *H02M 2007/4815* (2013.01)

(58) Field of Classification Search
CPC ......... H02M 7/5387; H02M 7/53871; H02M 2007/4811; H02M 2007/4815; H02M 2001/0058; H02M 2001/0054
USPC ............ 330/10, 51, 251, 253–255, 273, 297
See application file for complete search history.

(56) References Cited

U.S. PATENT DOCUMENTS

| 5,917,722 A * | 6/1999 | Singh ..................... H02M 7/538 363/132 |
| 2006/0006933 A1* | 1/2006 | Nguyen .................... H03F 1/32 330/10 |
| 2008/0297248 A1* | 12/2008 | Honda ................... H03F 3/2173 330/251 |
| 2014/0077885 A1* | 3/2014 | Frium ............... H02M 3/33569 330/297 |
| 2014/0159811 A1* | 6/2014 | Chen ..................... H03F 3/2171 330/251 |

* cited by examiner

*Primary Examiner* — Timothy J Dole
*Assistant Examiner* — Ishrat Jamali
(74) *Attorney, Agent, or Firm* — Angel N. Gerdzhikov; Donna P. Suchy; Daniel M. Barbieri

(57) ABSTRACT

A bi-directional Class D half-bridge power amplifier circuit incorporates soft switching components to reduce switching losses by commutating the voltage across the high and low switches of the half-bridge. The power amplifier may further be embodied in an AC power inverter configured to generate 60 Hz sinusoidal current from a DC power source. The AC power inverter may further incorporate an active filter circuit including a current shunt resistor and negative feedback loop to attenuate ripple current from the DC power source by supplying a compensating ripple voltage to the AC power inverter.

14 Claims, 5 Drawing Sheets

BI-DIRECTIONAL SOFT-SWITCHING CLASS-D POWER AMPLIFIER

BACKGROUND

Switching power amplifier circuits are the primary means of creating a power signal with high electrical efficiency. Pulse-width-modulated Class D amplifiers (ex.—half bridges, full bridges), for example, are commonly used for applications such as servo motor controls, power supplies, speaker drivers, or power filters. Smaller size requirements drive circuit designs to higher switching frequencies. While one consequence is a reduction in the size of inductors and capacitors, another is the frequency proportional increase in switching loss and a corresponding decrease in the overall efficiency of the circuit. The primary reason for these increased switching losses, which in turn limits the upper range of switching frequencies, is the activation of one switching device (ex.—switch device, device) while its drain-source voltage is nonzero. The charge of the device's drain-source capacitance is discharged into the device channel, resulting in a frequency-proportionate energy loss. Soft-switching circuitry may alleviate these switching losses by resonantly commutating the switching node voltage (ex.—drain-source voltage) such that the voltage across either switching device is reduced to zero immediately before activating the switch's conduction. However, soft-switching has previously been possible only for circuits with unidirectional current output flow. It may therefore be desirable to enhance the overall efficiency of a bi-directional power amplifier circuit by implementing soft-switching circuitry. It may additionally be desirable to adapt a soft-switching bidirectional power amplifier to provide a means of converting DC power to AC power (50 or 60 Hz, 120 or 220 V) to permit backward compatibility of existing consumer electronics with photovoltaic cells and other alternative energy sources. It may still further be desirable to ensure that current drawn from such a DC power source is free of ripple current.

SUMMARY

In one aspect, embodiments of the inventive concepts disclosed herein are directed to a bidirectional soft-switching power amplifier configured to generate an output signal (ex.—output current) by switching between a current-source mode (ex.—source mode) and a current-sink mode (ex.—sink mode). In one embodiment, the bidirectional soft-switching power amplifier includes a first switching circuit including two switching devices: a first switching device having a first drain, a first source, and a first drain-source voltage, and a second switching device having a second drain, a second source, and a second drain-source voltage. For example, the first switching device may be configured to be driven by a first drive signal in source mode and to be deactivated (ex.—driven off) in sink mode, and the second switching device may be configured to be driven by a second drive signal in sink mode and to be deactivated in source mode. In one embodiment, at least one pulse-width-modulated (PWM) signal generates the first drive signal or the second drive signal. In one embodiment, the bidirectional soft-switching power amplifier is configured to transition between source mode and sink mode by deactivating both the first switching device and the second switching device. In one embodiment, the bidirectional soft-switching power amplifier includes a first steering device having at least a third drain and a third source coupled to the first source, the first steering device configured to be driven by a third drive signal in source mode. In one embodiment, the bidirectional soft-switching power amplifier includes a second steering device having at least a fourth drain and a fourth source coupled to the second drain, the second steering device configured to be driven by a fourth drive signal in sink mode. In one embodiment, the bidirectional soft-switching power amplifier includes two choke clamping devices: a first clamping device having an anode coupled to the output signal and a second clamping device having a cathode coupled to the output signal. In one embodiment, the bidirectional soft-switching power amplifier includes a resonant circuit coupled to the output signal and including at least an inductor and a capacitor, configured to commutate to zero the first drain-source voltage or the second drain-source voltage.

In a further aspect, embodiments of the inventive concepts disclosed herein are directed to an AC power inverter circuit configured to generate a 60 Hz sinusoidal output signal and incorporating at least one bi-directional soft-switching power amplifier. In one embodiment, the power inverter may be configured as a full-bridge circuit further including a second switching circuit configured to generate a first 60 Hz square wave signal, and the first bi-directional switching power amplifier modified to generate a waveform equal to a 60 Hz sine wave from which is subtracted a 60 Hz square wave of equal amplitude. For example, the second switching circuit may include at least a third switching device and a fourth switching device. In one embodiment, the differential output signal of the at least one bi-directional soft-switching power amplifier and the square-wave half-bridge may be a sinusoidal output signal.

In a still further aspect, the AC power inverter circuit further comprises a DC power source and at least one active filter circuit configured to attenuate the ripple current drawn from the DC power source. In one embodiment, the active filter circuit includes at least one current sensing means employed to monitor the DC power source. For example, the current sensing means may consist of a current shunt resistor placed in series with the DC feed to the power inverter. In one embodiment, the active filter circuit includes a negative feedback loop coupled to the current shunt resistor and to the PWM signal source of the at least one bi-directional soft-switching power amplifier. For example, the negative feedback loop may adjust the pulse width of the first drive signal or the second drive signal. Consequently, the net ripple current through the shunt resistor may be forced to zero, and a compensating ripple current supplied to the AC power inverter circuit.

It is to be understood that both the foregoing general description and the following detailed description are exemplary and explanatory only and are not necessarily restrictive of the inventive concepts disclosed and claimed herein. The accompanying drawings, which are incorporated in and constitute a part of the specification, illustrate selected embodiments of the inventive concepts and together with the general description, serve to explain the principles of the inventive concepts.

BRIEF DESCRIPTION OF THE DRAWINGS

The inventive concepts disclosed herein may be better understood by those skilled in the art by reference to the accompanying figures in which.

DETAILED DESCRIPTION

Figure 1:
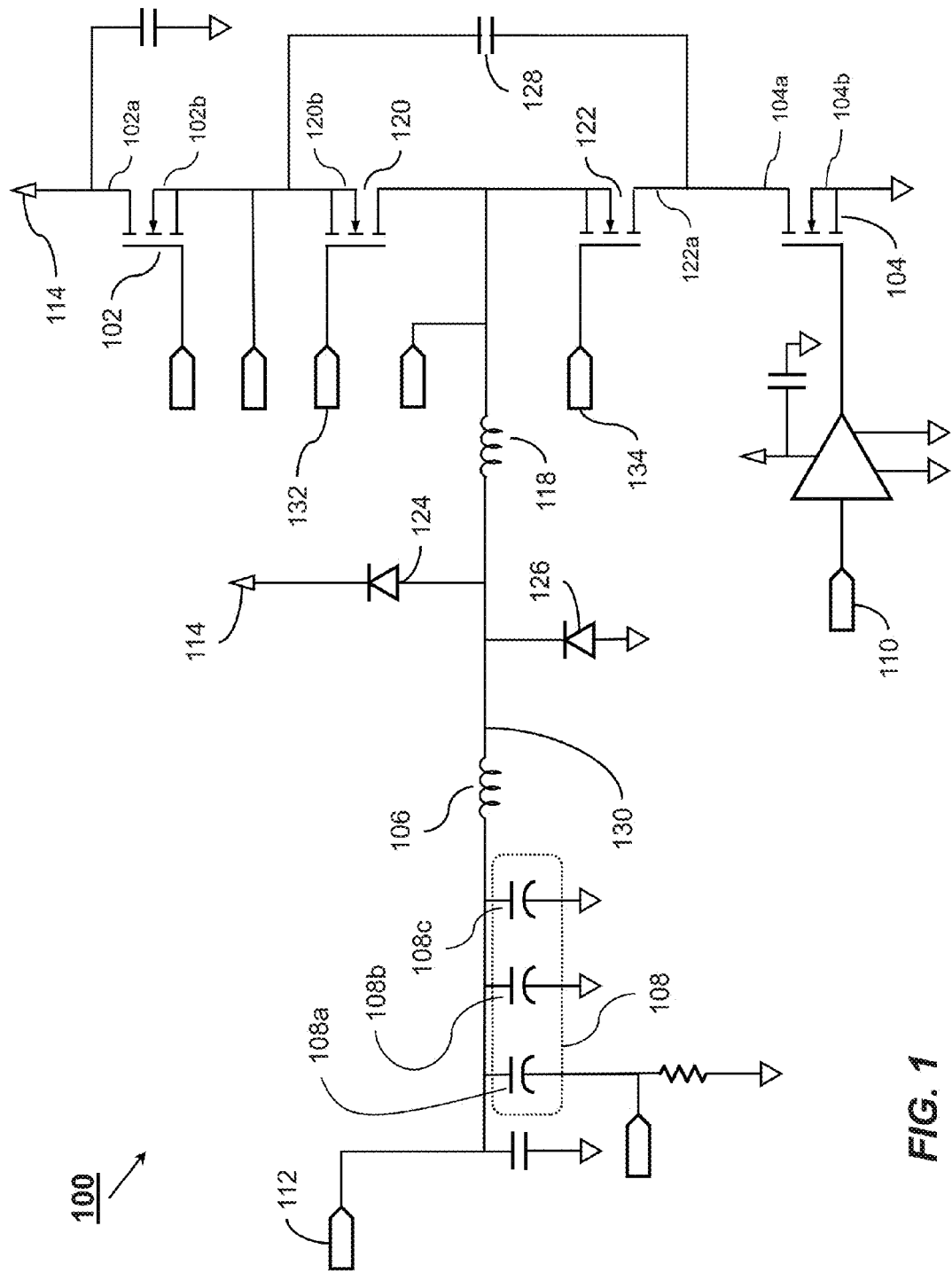
FIG. 1 illustrates an embodiment of a bidirectional soft-switching class D power amplifier circuit according to the inventive concepts disclosed herein.

FIG. 1 illustrates an embodiment of a bi-directional soft-switching Class D power amplifier circuit 100 according to the inventive concepts disclosed herein.

The power amplifier circuit 100 includes switching devices 102 and 104, inductor 106, and capacitor bank 108 (including one or more capacitors 108a-108c). For example, the switching devices 102 and 104 may be metal oxide semiconductor field effect transistors (MOSFET) or similar field effect transistors. The switching devices 102 and 104 are driven by (ex.—conduct via) pulse-width-modulated (PWM) drive signals. For example, the switching devices 102, 104 may be driven by a PWM drive signal 110 generated by a complementary PWM signal source. The power amplifier circuit 100 may alternate between two modes of operation. For example, the power amplifier circuit 100 may operate in a current-source mode (ex.—source mode), wherein current exits an inductor 106 toward a load 112. The power amplifier circuit 100 may also operate in a current-sink mode (ex.—sink mode), wherein current flows in the opposing direction (ex.—toward a drain 114 of a 400 V line). The power amplifier circuit 100 may transition between the conduction of the switching device 102 and the conduction of the switching device 104 by adding a brief transition period (ex.—"dead time") between modes, during which neither of the switching devices 102, 104 are driven on (i.e., both switching devices 102, 104 are driven off). For example, the power amplifier circuit 100 may observe a transition period of at least $\pi\sqrt{2(L)(C_{OSS})}$ seconds, where L is the inductance of an inductor 118 and $C_{OSS}$ is the drain-source capacitance (ex.—output capacitance) of the switching devices 102 or 104 (i.e., the capacitance between the first drain 102a and the first source 102b, or between the second drain 104a and the second source 104b.

The power amplifier circuit 100 may additionally include soft-switching current steering devices 120 and 122, clamping devices 124 and 126, and an LC resonant circuit comprising an inductor 118 and a capacitor 128. The current steering devices 120 and 122 may be MOSFETs or other similar field-effect transistors, connected in inverted fashion. For example, the source 120b of the current steering device 120 may be connected to the first source 102b, and the drain 122a of the current steering device 122 may be connected to the second drain 104a. The current steering device 120 may be driven on when the power amplifier circuit 100 is operating in current-source mode. The current steering device 122 may be driven on when the power amplifier circuit 100 is operating in current-sink mode. The power amplifier circuit 100 may switch (ex.—between conducting the switching device 102 and the switching device 104) at a pulse-width modulation frequency of 1 MHz, while the current steering devices 120, 122 are driven at a lower frequency of the output signal 130. For example, because the current steering devices 120, 122 are switched at a lower frequency than the switching devices 102 and 104, the current steering devices 120 and 122 may be driven by photovoltaic optoisolators or similar low-powered, low speed isolated drive circuits 132 and 134. For example, when the power amplifier circuit 100 is operating in current-source mode, and the current steering device 120 may be activated, when the switching device 102 is switched off while the capacitor 128 charged, commutating the drain-to-source voltage $V_{ds}$ across the switching device 104 to zero before the conduction of the switching device 104 is activated. The capacitor 128 may then discharge through the drain 102a of the switching device 102.

The choke clamping devices 124 and 126 may be Schottky diodes (i.e., metal-semiconductor diodes having a low forward voltage drop and a high switching speed) or similar rectifier diodes having minimal recovery time and capacitance. For example, the anode of the choke clamping device 124 and the cathode of the choke clamping device 126 may be connected to the output signal 130 of the power amplifier circuit 100. The LC resonant circuit of the power amplifier circuit 100 may include an inductor 118 of inductance L such that the LC circuit resonates against drain-source capacitance $C_{OSS}$ (ex.—drain-source capacitance of the switching device 102 or the switching device 104) at a resonant frequency at least five times the operating frequency of the PWM drive signal 110. The LC resonant circuit of the power amplifier circuit 100 may include a capacitor 128 of capacitance such that the LC circuit resonates against the inductance of inductor 118 at no higher than the operating frequency of the PWM drive signal 110.

Figure 2A:
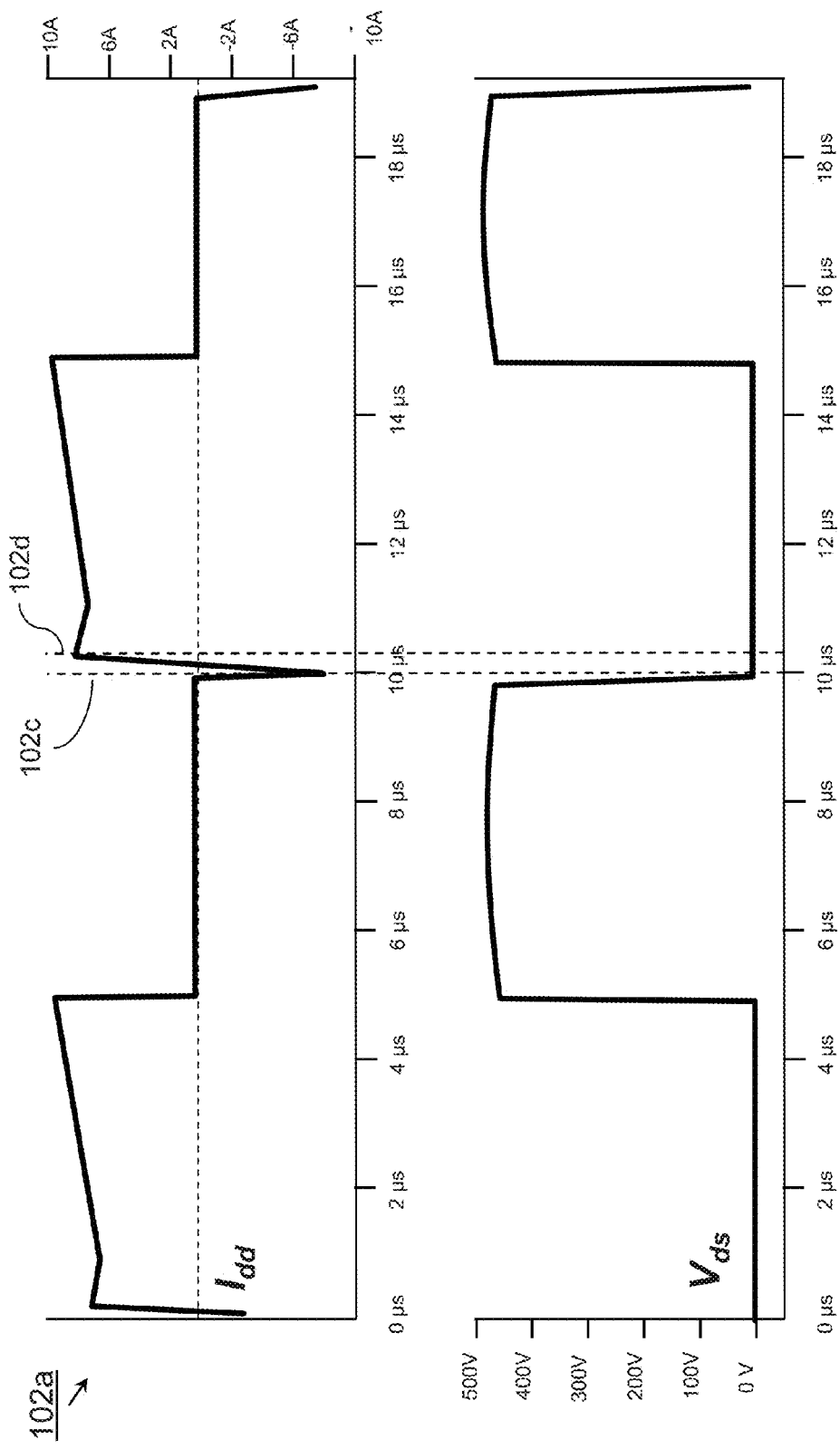
FIGS. 2A and 2B illustrate sample waveforms for switching devices of the bidirectional soft-switching class D power amplifier circuit of FIG. 1.
Figure 2B:
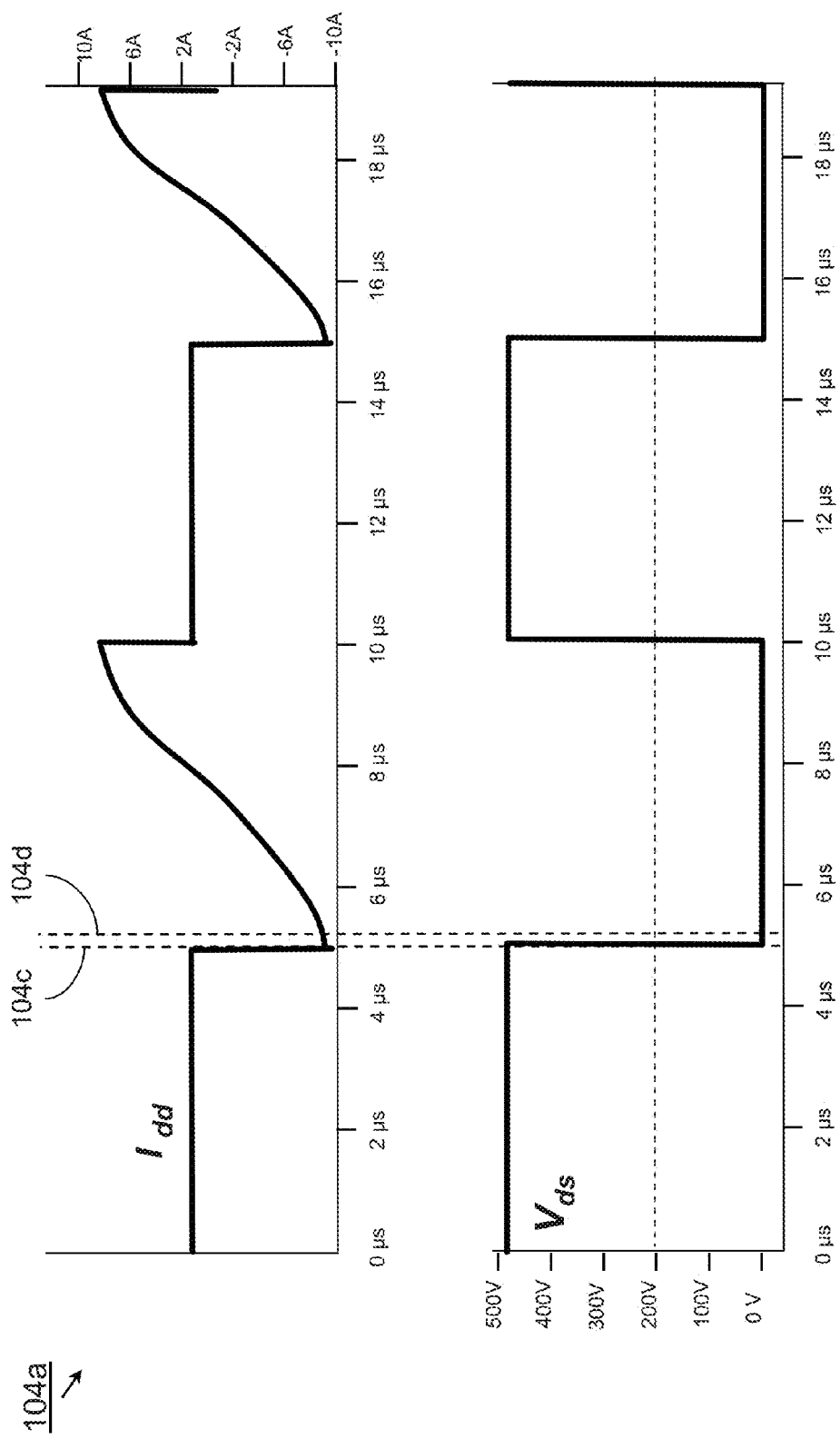

FIGS. 2A and 2B illustrate sample waveforms for drain-source voltage $V_{ds}$ and current $I_{dd}$ at the respective drains 102a, 104a of the switching devices 102 and 104 of the power amplifier circuit 100. As shown in FIG. 2A, the voltage $V_{ds}$ across the switching device 102 is commutated to zero (as indicated by dashed line 102c) immediately before the switching device 102 begins to conduct (as indicated by dashed line 102d). As shown in FIG. 2B, the voltage $V_{ds}$ across the switching device 104 is commutated to zero (as indicated by dashed line 104c) immediately before the switching device 104 begins to conduct (as indicated by dashed line 104d).

Figure 3:
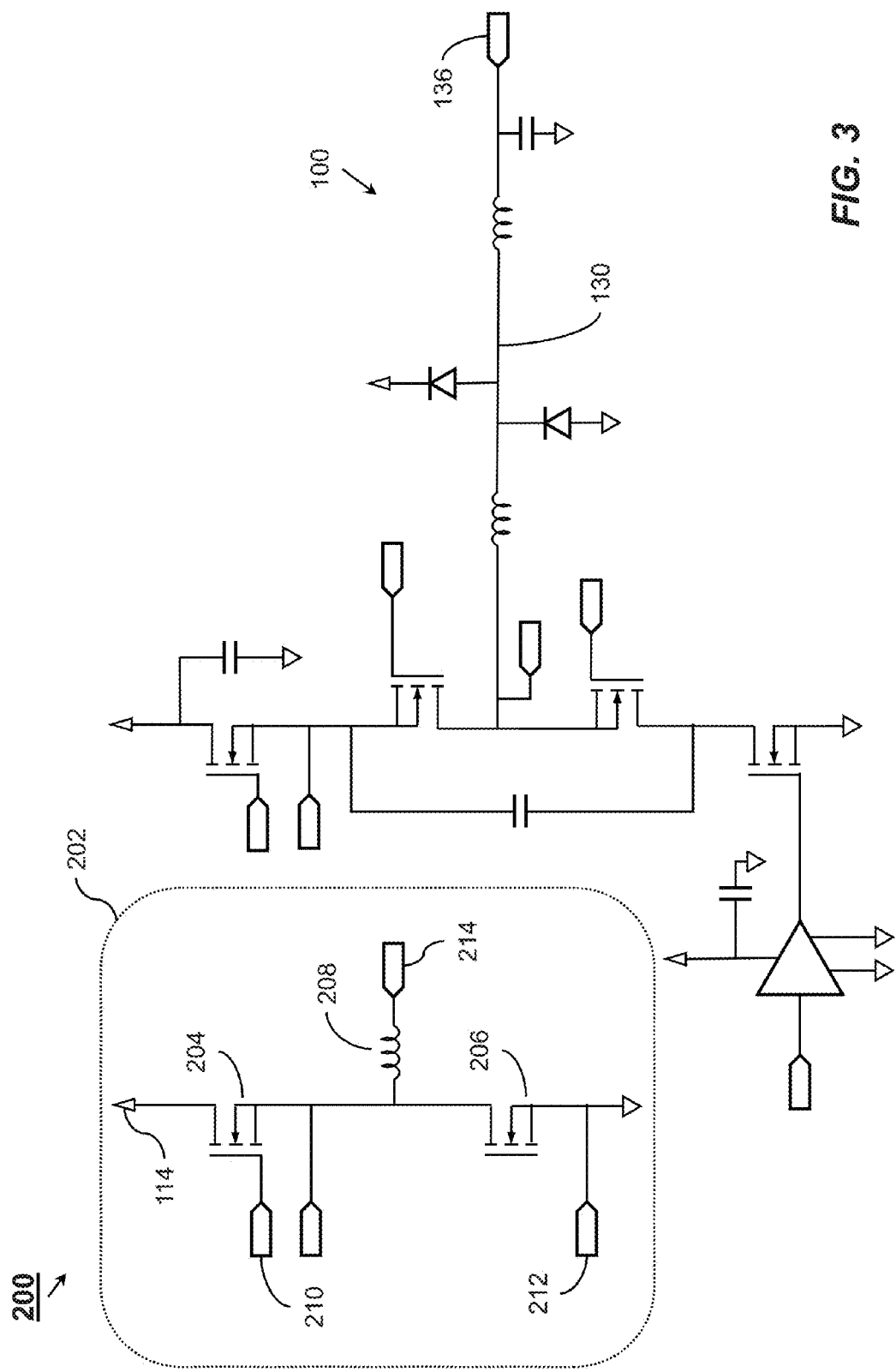
FIG. 3 illustrates an embodiment of a power inverter circuit according to the inventive concepts disclosed herein.

Referring to FIG. 3, the power amplifier circuit 100 may be embodied in an AC power inverter circuit 200. Soft-switching functionality incorporated into the power amplifier circuit 100 can reduce switching losses to approximately one-tenth that of an unmodified power amplifier circuit, resulting in approximately 95% efficiency for the power inverter 200. Consequently, switching frequencies may be increased tenfold over that of a similar circuit without soft switching, which in turn may allow for a significant reduction in the size of passive components.

The AC power inverter circuit 200 may generate a 240 V, 60 Hz sinusoidal output from a 450 V DC input. The AC power inverter circuit 200 may include a bi-directional soft-switching Class D power amplifier circuit 100 as described above and a 60 Hz square wave switching circuit 202 including switching devices (which may be MOSFETs or similar field effect transistors) 204, 206 and RF choke 208. The switching devices 204 and 206 may be driven at a relatively low frequency of the output signal 130 of the power amplifier circuit 100 by optoisolators or similar low-powered drive circuits 210, 212. The output signal 130 of the power amplifier circuit 100 (at the load 136) may be a differential signal from which the output signal of a square wave circuit 202 (at a load 214) is subtracted. For example, the output signal 130 at the load 136 may be a differential sum of a modified 60 Hz sine wave (corresponding to the output of the AC power inverter circuit 200) and a 60 Hz square wave signal (corresponding to the output of the square wave circuit 202 at the load 214).

Figure 4:
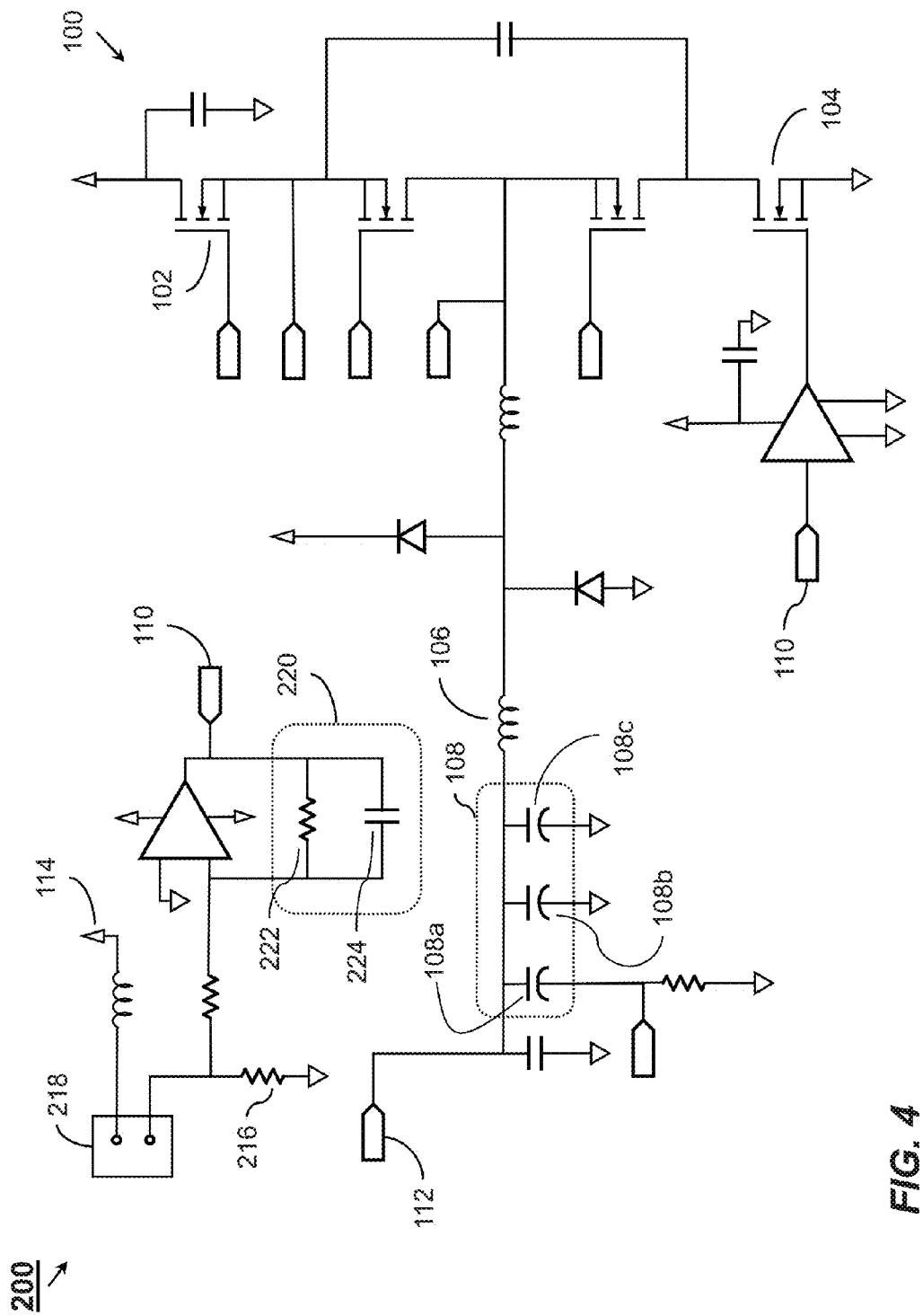
FIG. 4 illustrates an embodiment of a power inverter circuit including an active filter circuit according to the inventive concepts disclosed herein.

Referring now to FIG. 4, an AC power inverter circuit 200 may incorporate the components of the power amplifier circuit 100 as described above, and may further include an active filter circuit (ex.—current sensing means) 216 for attenuating ripple current from a DC power source 218 of the AC power inverter circuit 200. For example, the DC power source 218 may be a 450 V bulk DC supply. The current shunt resistor 216 may be serially connected to, and may monitor, the DC power source 218. The PWM switching devices 102 and 104 may be driven to generate an out of phase current to minimize 120 Hz AC ripple current drawn from the DC power source 214. For example, the ripple current through the current shunt resistor 216 may be forced to a net value of zero by a negative feedback loop 220 (including resistor 222 and capacitor 224) which controls the pulse width of the PWM drive signal 110 of the switching devices 102, 104 of power amplifier circuit 100. The capacitor bank 108 may be held to a nominally constant voltage as the switching device 102 is driven on by the PWM drive signal 110. For example, current may be forced through the inductor 106 (toward the load 112) to charge the capacitors 108a, 108b, 108c, supplying a compensating ripple current to the AC power inverter circuit 200.

While particular aspects of the subject matter described herein have been shown and described, it will be apparent to those skilled in the art that, based upon the teachings herein, changes and modifications may be made without departing from the subject matter described herein and its broader aspects and, therefore, the appended claims are to encompass within their scope all such changes and modifications as are within the true spirit and scope of the subject matter described herein.

I claim:

1. A bidirectional soft-switching power amplifier configured to generate an output signal, the bidirectional soft-switching power amplifier comprising:
    a first switching device having at least a first drain, a first source, and a first drain-source voltage, the first switching device configured to conduct via a first drive signal;
    a second switching device having at least a second drain, a second source, and a second drain-source voltage, the second switching device configured to conduct via a second drive signal;
    at least one complementary pulse width modulated (PWM) signal source coupled to the first switching device and the second switching device, the at least one complementary PWM signal source configured to generate at least one of the first drive signal and the second drive signal;
    the bidirectional soft-switching power amplifier configured to transition between a conduction of the first switching device and a conduction of the second switching device by deactivating both the first switching device and the second switching device periodically within a switching period of the complementary PWM signal source;
    a first steering device having at least a third drain and a third source, the third source coupled to the first source, the first steering device configured to be driven by a third drive signal;
    a second steering device having at least a fourth drain and a fourth source, the fourth drain coupled to the second drain, the fourth steering device configured to be driven by a fourth drive signal;
    at least a first clamping device including a first anode coupled to the output signal and a second clamping device including a first cathode coupled to the output signal; and
    a resonant circuit coupled to the output signal, the resonant circuit including at least an inductor and a capacitor and having at least one resonant frequency, the resonant circuit configured to commutate to zero at least one of the first drain-source voltage and the second drain-source voltage.

2. The bidirectional soft-switching power amplifier of claim 1, wherein the bidirectional soft-switching power amplifier is configured to transition between a conduction of the first switching device and a conduction of the second switching device by deactivating both the first switching device and the second switching device for at least $\pi\sqrt{2(L)(C_{OSS})}$ seconds, wherein L is an inductance of the inductor and $C_{OSS}$ is the drain-source capacitance of at least one of the first switching device and the second switching device.

3. The bidirectional soft-switching power amplifier of claim 1, wherein at least one of the first clamping device and the second clamping device includes a rectifier diode.

4. The bidirectional soft-switching power amplifier of claim 1, further comprising:
    at least one first drive circuit, configured to generate at least one of the third drive signal and the fourth drive signal.

5. The bidirectional soft-switching power amplifier of claim 4, wherein the at least one first drive circuit includes at least one isolated drive circuit.

6. A power inverter configured to generate a sinusoidal output, the power inverter comprising:
    at least one bidirectional soft-switching power amplifier configured to generate a differential output, the at least one bidirectional soft-switching power amplifier including:
        (a) a first switching circuit including at least a first switching device and a second switching device, the first switching device having at least a first drain, a first source, and a first drain-source voltage, the first switching device configured to conduct via a first drive signal, the second switching device having at least a second drain, a second source, and a second drain-source voltage, the second switching device configured to conduct via a second drive signal;
        (b) at least one complementary pulse width modulated (PWM) signal source coupled to the first switching device and the second switching device, the complementary PWM signal source configured to generate at least one of the first drive signal and the second drive signal;
        (c) the bidirectional soft-switching power amplifier configured to transition between a conduction of the first switching device and a conduction of the second switching device by deactivating both the first switching device and the second switching device periodically within a switching period of the complementary PWM signal source;
        (d) a first steering device having at least a third drain and a third source, the third source coupled to the first source, the first steering device configured to be driven by a third drive signal;

(e) a second steering device having at least a fourth drain and a fourth source, the fourth drain coupled to the second drain, the fourth steering device configured to be driven by a fourth drive signal;
(f) at least a first clamping device including a first anode coupled to the differential output and a second clamping device including a first cathode coupled to the differential output; and
(g) a resonant circuit coupled to the differential output, the resonant circuit including at least an inductor and a capacitor and having at least one resonant frequency, the resonant circuit configured to commutate to zero at least one of the first drain-source voltage and the second drain-source voltage; and a second switching circuit including at least a third switching device and a fourth switching device, the second switching circuit configured to generate a first square wave signal, wherein the differential output is equivalent to a differential sum of the sinusoidal output and the first square wave signal.

7. The power inverter of claim 6, wherein the bidirectional soft-switching power amplifier is configured to transition between a conduction of the first switching device and a conduction of the second switching device by deactivating both the first switching device and the second switching device for at least $\pi\sqrt{2(L)(C_{OSS})}$ seconds, wherein L is an inductance of the inductor and $C_{OSS}$ is the drain-source capacitance of at least one of the first switching device and the second switching device.

8. The power inverter of claim 6, wherein at least one of the first clamping device and the second clamping device includes a rectifier diode.

9. The power inverter of claim 6, wherein:
the first square wave signal is a 60 Hz square wave signal; and
the differential output is a 60 Hz sine wave.

10. The power inverter of claim 6, further comprising:
at least one first drive circuit, configured to generate at least one of the third drive signal and the fourth drive signal.

11. The power inverter of claim 10, wherein the at least one first drive circuit includes an isolated drive circuit.

12. The power inverter of claim 6, wherein:
the third switching device is configured to be driven by a third drive signal and the fourth switching device is configured to be driven by a fourth drive signal; and
the second switching circuit includes at least one second drive circuit coupled to at least one of the third switching device and the fourth switching device, the at least one second drive circuit configured to generate at least one of the third drive signal and the fourth drive signal.

13. The power inverter of claim 12, wherein the at least one second drive circuit includes an isolated drive circuit.

14. The power inverter of claim 6, further comprising:
at least one DC power source coupled to the power inverter;
at least one active filter circuit coupled to the at least one DC power source and configured to attenuate the ripple current drawn therefrom, the at least one active filter circuit including:
(a) a current sensing means serially coupled to the at least one DC power source; and
(b) a negative feedback loop coupled to the current sensing means and to the at least one complementary PWM signal source, the negative feedback loop configured to (1) force the ripple current through the at least one current sensing means to a net value of zero and (2) supply a compensating ripple current to the power inverter by adjusting the phase of at least one of the first drive signal and the second drive signal.

* * * * *